US010638645B1

(12) United States Patent
Moen et al.

(10) Patent No.: US 10,638,645 B1
(45) Date of Patent: Apr. 28, 2020

(54) LEAK DETECTION AND CONTAINMENT FOR LIQUID COOLED COMPUTING

(71) Applicant: Amazon Technologies, Inc., Seattle, WA (US)

(72) Inventors: Michael Jon Moen, Olympia, WA (US); Vijay Patel, Olympia, WA (US); Felipe Enrique Ortega Gutierrez, Tacoma, WA (US); Yaotsung Lee, New Taipei (TW)

(73) Assignee: Amazon Technologies, Inc., Seattle, WA (US)

(*) Notice: Subject to any disclaimer, the term of this patent is extended or adjusted under 35 U.S.C. 154(b) by 162 days.

(21) Appl. No.: 15/633,593

(22) Filed: Jun. 26, 2017

(51) Int. Cl.
| | |
|---|---|
| *H05K 7/20* | (2006.01) |
| *G21C 17/00* | (2006.01) |
| *G01M 3/18* | (2006.01) |
| *G21C 15/18* | (2006.01) |
| *G01M 3/04* | (2006.01) |

(52) U.S. Cl.
CPC .......... *H05K 7/20781* (2013.01); *G01M 3/18* (2013.01); *G21C 15/182* (2013.01); *G21C 17/002* (2013.01); *G01M 3/045* (2013.01); *G01M 3/188* (2013.01); *G06F 2200/201* (2013.01); *G21C 15/187* (2019.01); *H05K 7/20218* (2013.01)

(58) Field of Classification Search
CPC .. H05K 7/20781; F28F 1/003; F28F 2215/12; G01M 3/40; G06F 2200/201
See application file for complete search history.

(56) References Cited

U.S. PATENT DOCUMENTS

| | | | |
|---|---|---|---|
| 9,689,578 B2 * | 6/2017 | Matsuura | F24F 1/26 |
| 2004/0160741 A1 * | 8/2004 | Moss | G06F 1/20 |
| | | | 361/699 |
| 2008/0055112 A1 * | 3/2008 | McGinty | A47L 15/4212 |
| | | | 340/870.16 |
| 2014/0251583 A1 | 9/2014 | Eriksen | |

* cited by examiner

*Primary Examiner* — Ljiljana V. Ciric
*Assistant Examiner* — Alexis K Cox
(74) *Attorney, Agent, or Firm* — Kilpatrick Townsend & Stockton LLP

(57) ABSTRACT

An assembly for containing and detecting leaks from a coolant line includes a basin with side and end walls, and at least one U-shaped cavity in an end wall for receiving a coolant line of a liquid cooling system. A bottom of the basin includes at least one sloped interior surface arranged to divert water in the basin to a local low point, where a sensor is positioned and operable to detect liquid in the collection basin. A leak detection system can employ a leak detection assembly to detect and/or locate a leak.

15 Claims, 8 Drawing Sheets

US 10,638,645 B1

LEAK DETECTION AND CONTAINMENT FOR LIQUID COOLED COMPUTING

BACKGROUND

A datacenter typically contains a collection of computer servers and components for the management, operation and connectivity of those servers. Even in isolation, datacenter electronic components may generate sufficient heat that temperature management is important to prolong the life of the components and to allow smooth and continuous operation of the datacenter. Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

Datacenter electronic components may be cooled by passing air through the components, or by circulating a cooling fluid through heat exchangers coupled with components to form liquid-cooled systems. In the case of liquid cooled systems, cooling is achieved by circulating a coolant to a heat exchanger coupled with the components where it picks up waste heat, and subsequently circulating the coolant to a radiator or other secondary heat exchanger for removing the waste heat from the system, thus regenerating the coolant. The effectiveness of such cooling systems is related to the rate at which the coolant can be circulated to the components, and the efficiency with which the coolant can be regenerated; therefore it is advantageous to circulate the coolant rapidly. However, increased coolant flow rates can result in greater probabilities of coolant system failure, which can result in leaks from the cooling system into the computer system and damage to components therein.

BRIEF DESCRIPTION OF THE DRAWINGS

Various embodiments in accordance with the present disclosure will be described with reference to the drawings, in which.

DETAILED DESCRIPTION

Figure 1:
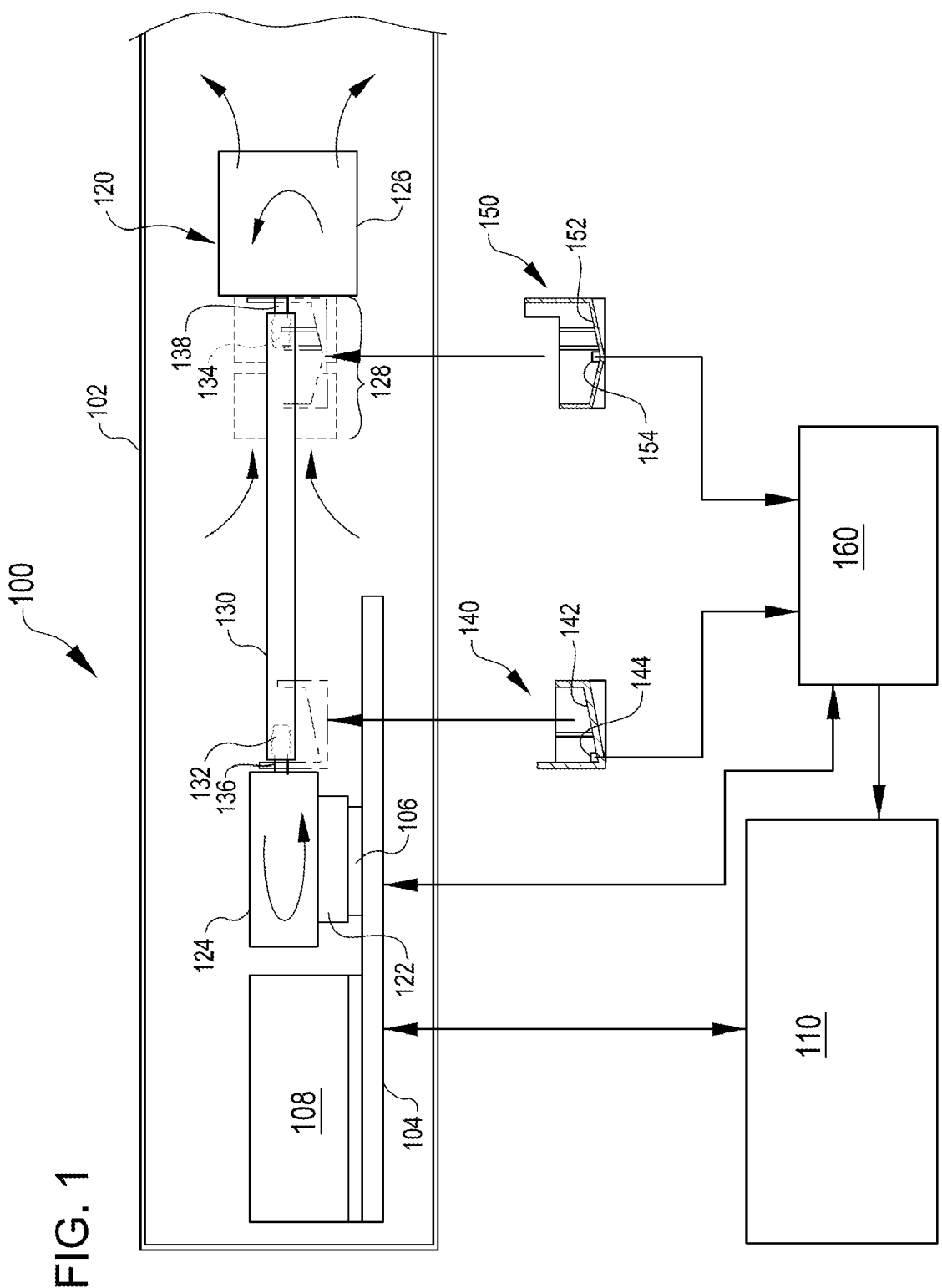
FIG. 1 is a side view diagrammatic illustration of a leak detection system for an electronic component employing a liquid cooling system, according to some embodiments of the present disclosure.

In the following description, various embodiments will be described. For purposes of explanation, specific configurations and details are set forth in order to provide a thorough understanding of the various embodiments. However, it will also be apparent to one skilled in the art that the various embodiments may be practiced without the specific details. Furthermore, well-known features may be omitted or simplified in order not to obscure the embodiment being described.

In accordance with various embodiments, an apparatus for containing and detecting leaks from a coolant line in a computing system cooling assembly is disclosed. The assembly includes a basin defined by a bottom, first and second ends, and first and second sides defining a volume for trapping and concentrating liquid coolant. The first end includes an end wall having a substantially U-shaped cavity therein, the U-shaped cavity configured to receive the coolant line and the wall being configured to block egress of liquid coolant along the coolant line past the end wall, instead being operable to divert liquid coolant down into the basin. The sides and ends define sidewalls and end walls that limit airflow from an environment of the assembly into the basin. The bottom of the assembly is formed of at least one sloped interior surface arranged to divert liquid coolant in the basin to a local low portion of the interior volume, where a liquid sensor is positioned at the local low portion and operable to detect liquid coolant in the basin.

In accordance with various other embodiments, methods and systems for detecting a leak in a computing system cooling assembly are also disclosed. A computing system cooling assembly including a first heat exchanger configured to transfer heat from a computing component, such as a processor to a liquid coolant, and a second heat exchanger (e.g., a radiator) configured to extract heat from the liquid coolant. A first coolant line transfers the liquid coolant between the first heat exchanger and the second heat exchanger, and a second coolant line transfers the liquid coolant from the second heat exchanger to the first heat exchanger. In accordance with at least some embodiments, methods include supporting a first collection basin and a second collection basin at local connections between the first and second heat exchangers and the first and second coolant lines. Each basin of the first and second basins is configured to collect a quantity of the liquid coolant in the event of a leakage of the liquid coolant from a connection between one of (a) the first heat exchanger and the first coolant line, (b) the second heat exchanger and the first coolant line, (c) the second heat exchanger and the second coolant line, and (d) the second heat exchanger and the first coolant line. A controller can monitor a first liquid sensor configured to detect the presence of the first quantity of the liquid coolant in the first collection basin, and the controller can monitor a second liquid sensor configured to detect the presence of the second quantity of the liquid coolant in the second collection basin, and detect leaks at the first or second basins based on signals returned from the first and second liquid sensors.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

FIG. 1 is a side view diagrammatic illustration of a computing resource 100 that includes a case 102 employing a liquid cooling system 120 to cool select parts therein, in accordance with at least some embodiments. The computing resource 100 can be any suitable heat-generating electronic component, e.g. a computer server or server board. As shown herein, the computing resource 100 includes a circuit board 104 such as a motherboard with a heat-generating part 104 such as a processor coupled thereto. Secondary components 108 also coupled with the motherboard can include any suitable variety of components that may be air-cooled, or may employ separate liquid cooled systems (not shown). The computing resource 100 is coupled with a power supply 110 that can provide electrical power to the motherboard 104 and components coupled thereto, and may also provide components to other aspects of the electronic component. A liquid cooling system 120 is coupled with the computing resource 100 and positioned in the case 102.

The liquid cooling system 120 includes a first heat exchanger 124 coupled with the heat-producing component 106. In some embodiments, the first heat exchanger 124 is thermally coupled with the heat producing component 106 by way of a thermally conductive block and/or thermally conductive material such as a thermal paste or the like. The first heat exchanger 124 circulates a liquid coolant such as water, a water/ethylene glycol mixture, a water alcohol mixture, or any other suitable liquid coolant mixture operable at computer component temperatures (i.e., in a range of about 5° C. to about 85° C.).

The liquid cooling system 120 includes a second heat exchanger 126 which is fluidly coupled with the first heat exchanger 124 by way of a coolant line 130 that carries hot liquid coolant from the first heat exchanger to the second. Additional coolant lines (see FIG. 2) can be used to transport the liquid coolant in a loop back to the first heat exchanger 124. The second heat exchanger 126 is generally used to exhaust heat from the liquid cooling system 120 by way of convective heat transfer to the environment, thereby regenerating the liquid coolant. In some embodiments, the second heat exchanger 126 is a radiator, and the liquid cooling system 120 includes a bank of one or more fans 128 that can push air through the second heat exchanger to cool the liquid coolant inside. The bank of fans 128 can serve a dual purpose of also generating airflow to cool secondary components 108. However, alternative embodiments can use alternative constructions of the liquid cooling system 120, including arrangements where the second heat exchanger 126 operates by natural convection, by transferring heat to a secondary loop of liquid coolant, or by transferring heat to an external radiator outside of the case 102.

Fluid containing components in the liquid cooling system 120 are connected together by way of a series of watertight interfaces, e.g. a first connection 132 connects a first watertight connector 136 of the first heat exchanger 124 with the coolant line 130; and a second connection 132 connects a second watertight connector 138 of the second heat exchanger 126 with the coolant line 130. Suitable watertight connectors can include swage-type fittings, threaded fittings, sealants such as glue or water impermeable tape, nipple threads, or the like; and the coolant line 130 can include any suitable conduit, hose, or pipe suitable for carrying the preferred coolant fluid. Suitable materials for the coolant line can include rubber or polymer hose or rigid tubing, metal tubing, or the like. Although the respective interfaces are each sealed to prevent leakage, over time, slow leaks may develop at one or another of the connections due to, e.g., repetitive pressure and/or temperature changes resulting from continued operation.

A slow leak occurring at or near either the first connection 132 or second connection 134 can be collected and detected by way of a leak detection assembly, in accordance with at least some embodiments. A first leak detection assembly 140 is shown in position to connect with the coolant line 130 at the first connection 132; and a second leak detection assembly 150 is shown in position to connect with the coolant line at the second connection 134. Each of the leak detection assemblies 140, 150 includes a basin 142, 152 for capturing liquid leaked from the liquid cooling system 120; and in each case, the basin 142, 152 is sloped to concentrate liquid at a respective sensor 144, 154 positioned in the basin. The leak detection assemblies 140, 150 connect with the coolant line 130 to contain liquid where it leaks, typically from one of the first or second connections 132, 134, and allow the liquid to drop directly into the basin 142, 152.

The sensors 144, 154 are liquid sensors operable to detect very small volumes of liquid. In some embodiments, the sensors 144, 154 are conductivity-based two-wire sensors made up of a pair of wires separated by a small space from one another. The pair of wires making up each sensor 144, 154 may be separated by a porous material that can absorb liquid, or may be mechanically separated and held at a fixed distance from each other within a small volume corresponding to the sensor. The basins 142, 152 can define liquid-containing volumes sufficient to contain a small leak and prevent the leak from impacting the computing resource 100. According to specific embodiments, the basins 142, 152 can define liquid containing volumes up to about 220 cm$^3$, or preferably from about 0.5 to 30 cm$^3$.

Each sensor 144, 154 is connected with a management component 160 that operates the sensors and outputs a signal when any sensor detects liquid. According to some embodiments, the management component 160 outputs a control signal to the sensors 144, 154, which include a separated signal lead and ground lead. Provided the leads remain electrically isolated, no current passes between the leads and the management component 160 reads an output voltage corresponding to a null condition indicating no leaks. When a conductive liquid, such as a liquid coolant, leaks into one of the basins 142, 152 and encounters a sensor 144, 154, the leads of the impacted sensor are electrically connected by the liquid and return a lower output voltage corresponding to a short at the sensor and indicative of a leak to the management component 160.

Figure 2:
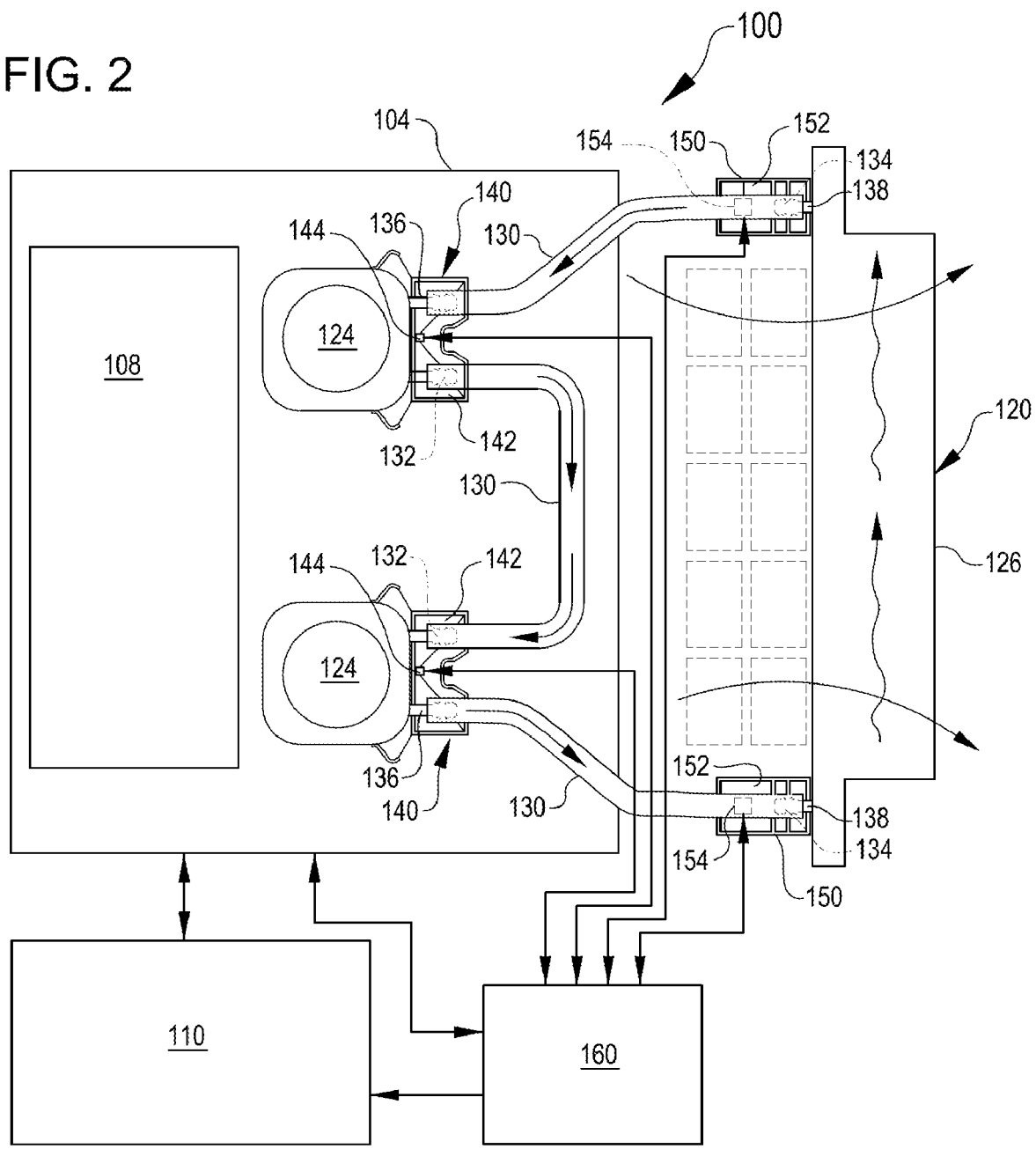
FIG. 2 is a top view diagrammatic illustration of the leak detection system shown in FIG. 1, in greater detail.

FIG. 2 is a top view diagrammatic illustration of the computing resource 100 and associated cooling system 120 shown in FIG. 1, in greater detail, and in which like numbers represent like elements. The cooling system 120 can include multiple first heat exchangers 124 each corresponding to a heat-generating component in the computing resource 100. Although two such first heat exchangers 124 are shown, it will be understood that a single cooling system 120 can be used to cool any suitable number of heat-generating components depending on the capacity of the cooling system to exhaust heat and the amounts of heat produced by each component. Multiple liquid coolant-containing coolant lines 130 are connected between the first heat exchangers 124 and the second heat exchanger 126 to form a continuous loop for moving the liquid coolant throughout the cooling system 120. A single second heat exchanger 126 is shown herein, but it will also be understood that multiple second heat exchangers can be used.

Figure 3:
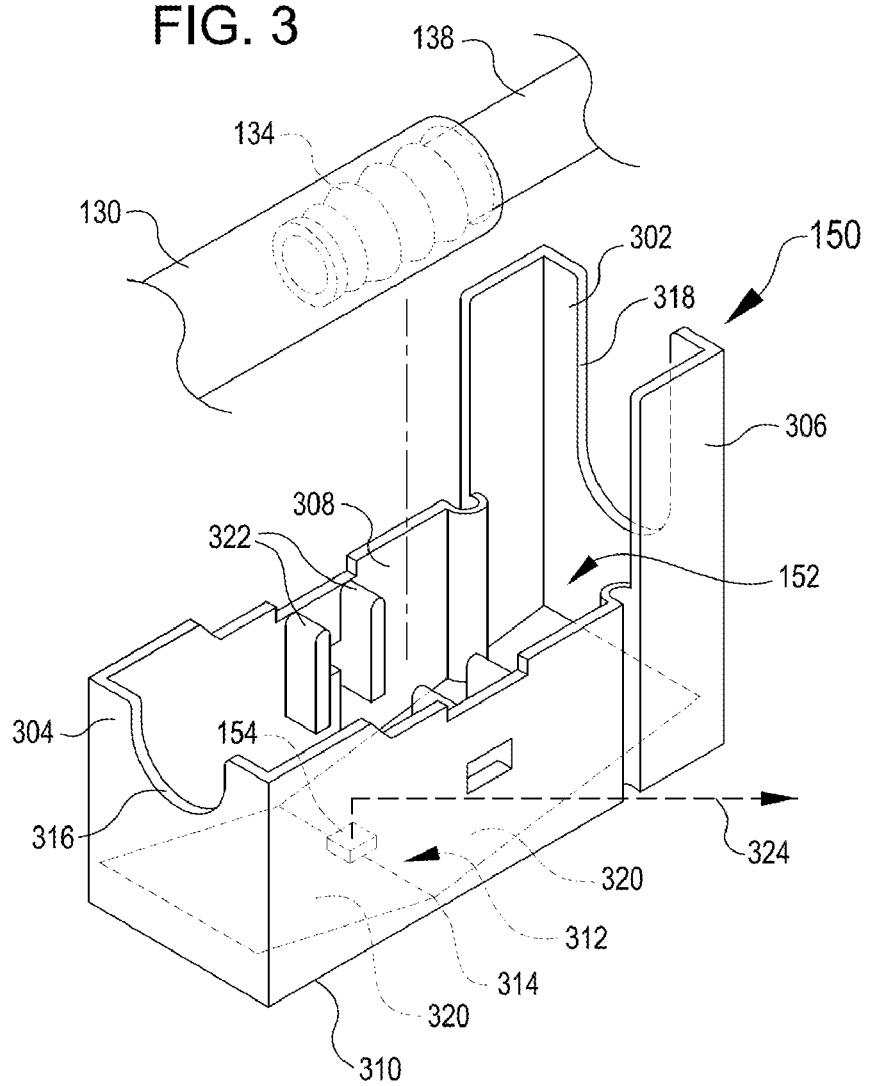
FIG. 3 is a perspective view of a first example of a leak detection assembly for use in a leak detection system, in accordance with some embodiments.

In accordance with at least some embodiments, multiple first leak detection assemblies 140 can be used, each of the first leak detection assemblies associated with a respective pair of interfaces 132 between two coolant lines 130 and dual first watertight connectors 136 of one of the first heat exchangers 124. Thus, the first leak detection assemblies 140 can be used to capture and detect a leak from either of two, first watertight connectors 136. According to embodiments, each of the first leak detection assemblies 140 can be configured to concentrate water leaked from either or both of two coolant lines 130 disposed above the leak detection assembly to a single sensor, which is operably coupled with the sensor management component 160. Conversely, where the coolant lines 130 are spaced far apart and interface with the second heat exchanger 126, the second leak detection assemblies 150 can be used. Each of the second leak detection assemblies 150 is configured to connect with one of the coolant lines 130 at a respective second connection 134, where the coolant lines 130 connect with the second heat exchanger 126. Each leak detection assembly 140, 142 is operably connected, e.g. by way of a wired connection, with the sensor management component 160. Exemplary embodiments of the leak detection assemblies 140, 150 are described below with reference to FIGS. 3 and 4. However, it will be understood that the FIG. 3 is a perspective view of a first example of a leak detection assembly 150 for use in detecting leaks in a liquid cooled computer resource such as computer resource 100 (FIGS. 1-2), in accordance with at least some embodiments. The leak detection assembly 150 corresponds to the second leak detection assembly 150 shown in FIGS. 1-2.

The leak detection assembly 150 includes a first end wall 302, a second end wall 304 opposite the first end wall, two side walls 306 and 308, and a bottom 310 defining a basin 152. The basin 152 has sufficient volume to capture and hold a small volume of liquid coolant. The first and second end walls 302, 304 and the first and second sides 306, 308 cooperate to form a partial barrier to air flow from an environment around the basin 152 in order to prevent rapid evaporation or spray of leaked liquid from the basin. The side walls 306, 308 and second end wall 304 are sufficiently high to partially block forced air from, e.g., fans 128 (FIGS. 1-2). For example, in various embodiments the walls 304, 306, 308 are each about 1 cm, 2 cm, 3 cm, or 4 cm high, or another height.

The bottom 310 of the basin 152 is defined by at least one sloped inner surface 312, which can include two or more sloped inner surfaces, which slope to a local low portion 314 of the interior volume. Where the sloped inner surface 312 is formed of two or more sloped surfaces, the sloped surfaces slope toward one another to form the local low portion 314 where the sloped surfaces meet. The sloped inner surface 312 is formed of a smooth, water impermeable material such as a plastic, metal, plastic or metal coated with a hydrophobic material, or other comparable material which can cause a liquid coolant to run down and concentrate at the local low portion 314. A sensor 154 is positioned within the local low portion 314. In some cases, the sensor 154 can be embedded in the local low portion, e.g., in a cavity that can further concentrate liquid, so that even very small volumes of liquid can fully inundate the sensor 154. The sensor 154 can receive an input signal and output an output signal via a line out 324, which can connect with a sensor management component 160 (FIGS. 1-2).

The leak detection assembly 150 further includes a first U-shaped or substantially U-shaped cavity 318 in the first end wall 302 sized to receive a coolant line 130 or connector 138 of a liquid cooling system 120 (FIGS. 1-2). The first U-shaped cavity 318 allows the coolant line 130 or connector 138 to rest fully encompassed by the first end wall 302, which is then operable to prevent liquid from passing along an outer surface of either the coolant line 130 or connector 138 through past the first end wall 302, instead being directed to fall into the basin 152. Optionally, a second U-shaped cavity 316 can be positioned in the second end wall 304 shaped to receive the other of the coolant line 130 or connector 138, and operable to trap leaked liquid in the basin 152 in the same manner as the first U-shaped cavity 318. Both of the first and second U-shaped cavities 318, 316 are shown herein having the shape of a notch with a semicircular end to match a cylindrical coolant line 130; however, alternative U-shaped cavities can have any suitable shape to match a liquid coolant-containing coolant line of a different geometry (e.g., hexagonal, square, elliptical, etc.).

In accordance with at least some embodiments, the leak detection assembly 150 is shaped to align with a connection 134 between a coolant line 130 and a connector 138 (see FIGS. 1-2). The basin 152 can include one or more physical extensions 322 from the side walls 306, 308 that align the basin with the connection 134 to position the connection above the sensor 152. According to some embodiments, the physical extensions 322 include at least one flange that extends into the basin 152 to interact with the sensor 152 to retain the sensor and to align the sensor with the coolant line 130 or connector 138 near the connection 134. The leak detection assembly 150 can further include features for connecting the basin 152 with the coolant line 130 and/or connector 138. For example, any one of, or all of, the first and second U-shaped cavities 318, 316 or the physical extensions 322 from the side walls 306, 308 can be shaped to mechanically interfere with or clasp the coolant line or connector when the leak detection assembly 150 is attached with the coolant line.

Figure 4:
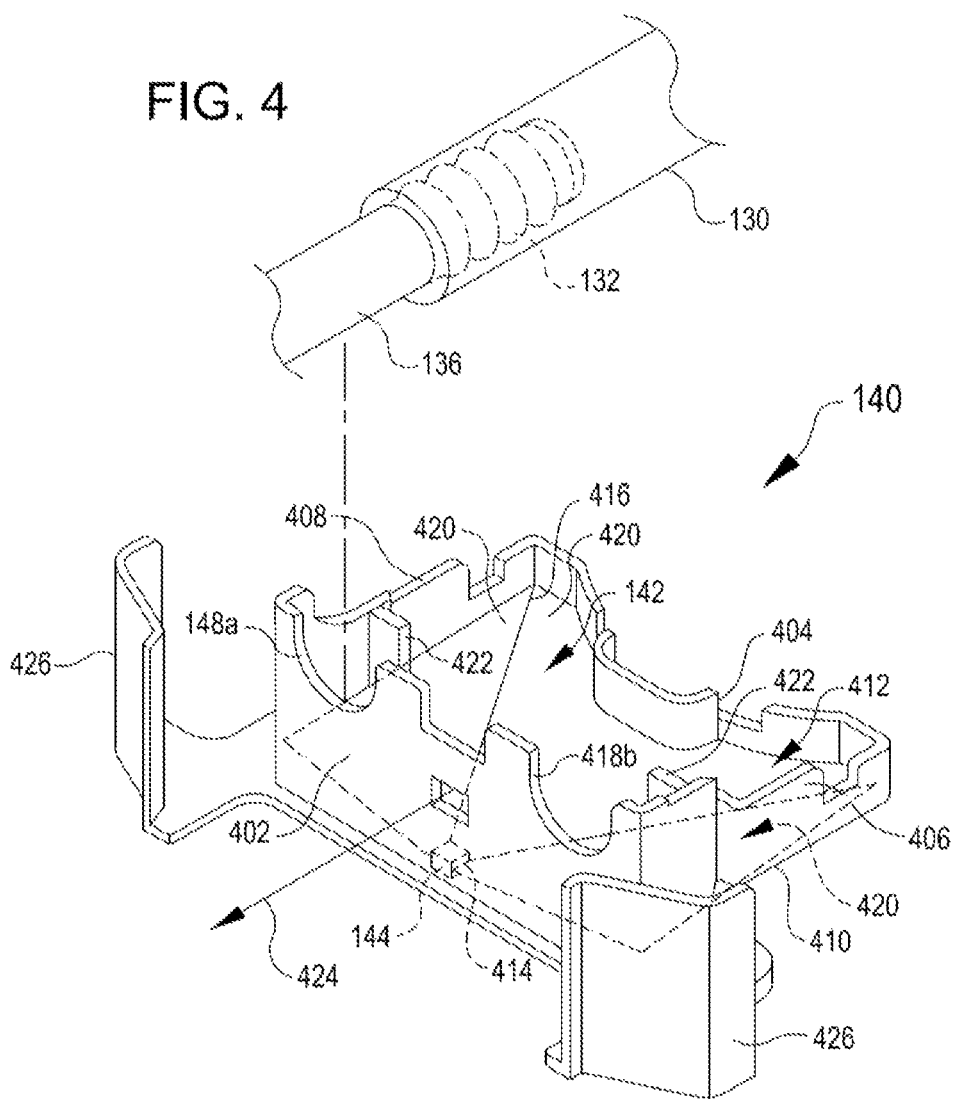
FIG. 4 is a perspective view of a first example of a leak detection assembly for use in a leak detection system, in accordance with some embodiments.

FIG. 4 is a perspective view of a second example of a leak detection assembly 140 for use in detecting leaks in a liquid cooled computer resource such as computer resource 100 (FIGS. 1-2), in accordance with at least some embodiments. The leak detection assembly 140 corresponds to the first leak detection assembly 140 shown in FIGS. 1-2.

The leak detection assembly 140 includes a first end wall 402 shaped to abut a heat exchanger for a heat-producing element, a second end wall 404 opposite the first end wall, two side walls 406 and 408, and a bottom 410 defining a basin 142. The basin 142 has sufficient volume to capture and hold a small volume of liquid coolant. The first and second end walls 402, 404 and the first and second sides 406, 408 cooperate to form a partial barrier to air flow from an environment around the basin 142 in order to prevent rapid evaporation or spray of leaked liquid from the basin. The side walls 406, 408 and second end wall 404 are sufficiently high to partially block forced air from, e.g., fans 128 (FIGS. 1-2). One or more vertically disposed vanes 426 can be connected with the basin 152 and positioned offset in any suitable direction from the basin with respect to a flow direction of forced air in order to divert air for improving the cooling efficiency for the computer resource 100. The vanes 426 shown here are positioned separated from one another to accommodate a heat exchanger therebetween that also blocks airflow. It will be understood that, in various alternative embodiments, the positions of the vanes 426 may vary in order to protect the basin 142 from airflow.

The bottom 410 of the basin 142 is defined by at least one sloped inner surface 412, which can include two or more sloped inner surfaces 420, which join together to concentrate any leaked liquid thereon to a local low portion 414. The sloped surfaces 420 slope toward one another to form the local low portion 414 where the sloped surfaces meet. The sloped inner surface 412 is formed of smooth, water impermeable material such as a plastic, metal, plastic or metal coated with a hydrophobic material, or other comparable material which can cause a liquid coolant to run down and concentrate at the local low portion 414. A sensor 144 is positioned within the local low portion 414. In some cases, the sensor 144 can be embedded in the local low portion, e.g., in a cavity that can further concentrate liquid, so that even very small volumes of liquid can fully inundate the sensor 144. The sensor 144 can receive an input signal and output an output signal via a line out 424, which can connect with a sensor management component 160 (FIGS. 1-2).

The leak detection assembly 140 further includes first and second U-shaped or substantially U-shaped cavities 418a, 418b (cumulatively 418) in the first end wall 402 sized to receive parallel coolant lines 130 or connectors 136 of a liquid cooling system 120 (FIGS. 1-2). Each of the U-shaped cavities 418 allow a respective coolant line 130 or connector 136 to rest fully encompassed by the first end wall 402, which is then operable to prevent liquid from passing along an outer surface of either the coolant line 130 or connector 136 past the first end wall 402 where the leaked liquid might damage an electronic component, instead being directed to fall into the basin 142. Both of the U-shaped cavities 418 are shown herein having the shape of a notch with a semicircular end to match a cylindrical coolant line 130; however, alternative U-shaped cavities can have any suitable shape to match a liquid coolant-containing coolant line of a different geometry (e.g., hexagonal, square, elliptical, etc.).

In accordance with at least some embodiments, the leak detection assembly 140 is shaped to align with a connection 132 between a coolant line 130 and a connector 136 (see FIGS. 1-2). The basin 142 can include one or more physical extensions 422 from the side walls 406, 408 that align the basin with the connection 132 to position the connection above the sensor 142. According to some embodiments, the physical extensions 422 include at least one flange that extends into the basin 142 to interact with the sensor 142 to retain the sensor and/or to align the sensor with the coolant line 130 or connector 136 near the connection 132. The leak detection assembly 140 can further include features for connecting the basin 142 with the coolant line 130 and/or connector 136. For example, any one of, or all of, the U-shaped cavities 418 or the physical extensions 422 from the side walls 406, 408 can be shaped to mechanically interfere with or clasp the coolant line or connector when the leak detection assembly 140 is attached with the coolant line.

The leak detection assemblies 140, 150 can be used in conjunction with a computing resource and liquid cooling system similar to computing resource 100 and cooling system 120 described above with respect to FIGS. 1-2 by interfacing with a leak detection system that controls the leak detection assemblies and provides instructions to components associated with the computing resource. For example, FIG. 5 is a simplified block diagram illustration of a leak detection system 500 for use in a liquid cooling system as shown in FIG. 1, in accordance with at least some embodiments.

Figure 5:
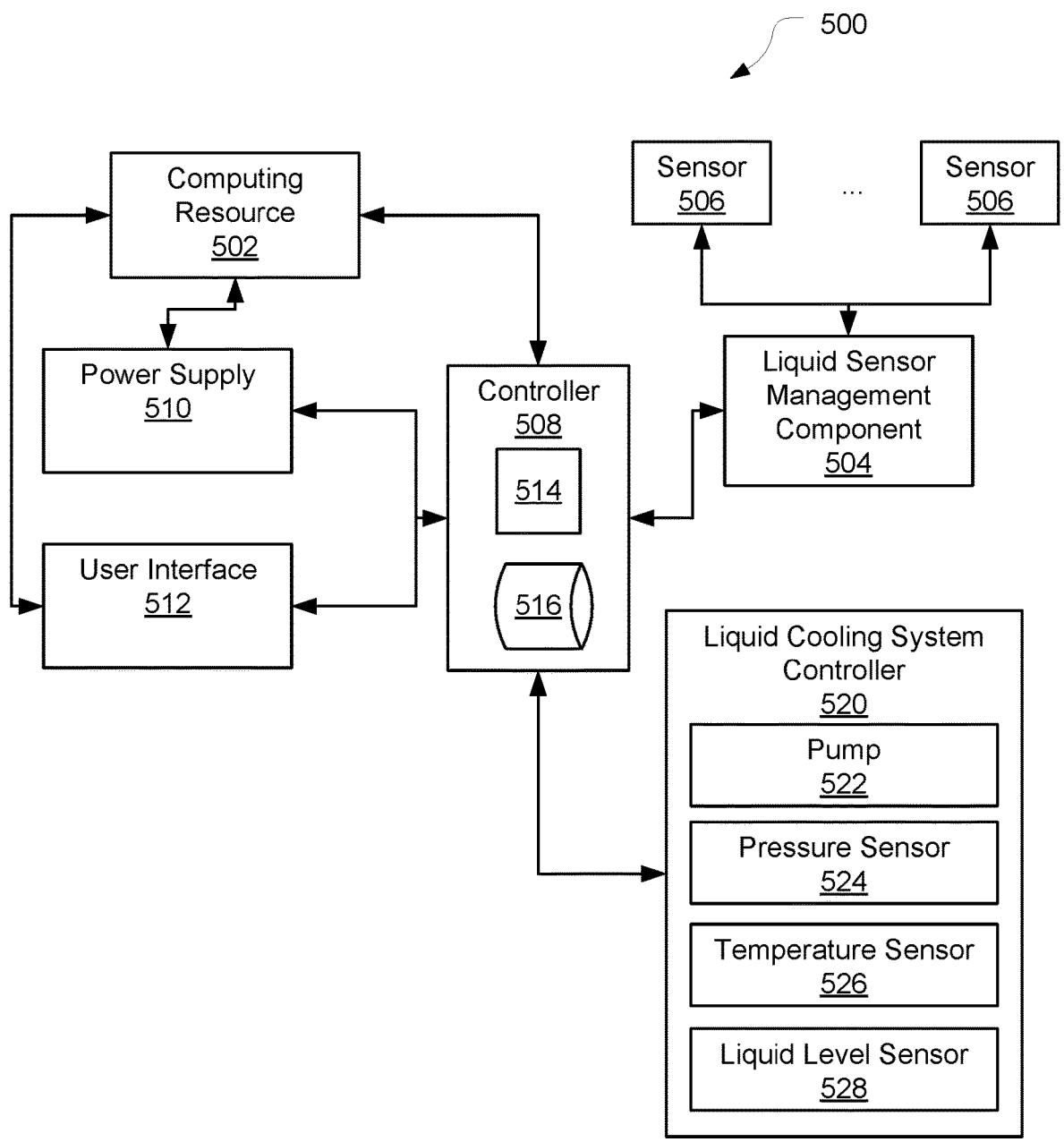
FIG. 5 is a simplified block diagram illustration of a leak detection system for use in a liquid cooling system as shown in FIG. 1, in accordance with at least some embodiments.

FIG. 5 illustrates an example of a leak detection system 500 for detecting leaks in a liquid cooling system used to cool a computing resource. The system 500 includes a controller 508 which contains a processor 514 and nontransitory memory 516 containing instructions for enabling operation of the system 500. According to some embodiments, the controller 508 is a baseboard management controller (BMC), which can be further operable to monitor other aspects of the computer resource 502 and associated cooling, power, control, network, or related systems. The controller 508 is operable to control the components of the system 500 to detect and respond to leaks affecting a computer resource 502. The computing resource 502 may contain processing and memory for running various processes and services as well, and in some cases may also include the controller 508, however, for purposes of clarity, the controller 508 is shown separately. The controller 508 may be co-located with the computing resource 502, or may be separated from the computing resource and control components of the system 500 remotely. It will be understood that the computing resource 502 may also refer to a liquid sensitive resource that is not, itself, a computing system. The computing resource 502 is operable connected with a power supply 510 for drawing power, with at least one user interface 512 for displaying information to user or for receiving input from a user, and with the controller 508. The controller 508 may also be operably connected with the power supply 510 and with the user interface 512.

At least one sensor 506, and preferably multiple sensors, are co-located with the physical hardware of the computing resource 502 and coupled with elements of a liquid cooling system such as liquid cooling system 120 (FIGS. 1-2). The sensors 506 are positioned in basins connected with the liquid cooling system similar to sensors 144, 152 (see FIGS. 3-4). The sensors 506 are connected with a liquid sensor management component 504 which is operable to provide a control signal to each sensor 506 and receive an output indicative of a status of each respective basin, i.e., whether a leak has occurred. The liquid sensor management component can communicate the output indicating the status of each sensor to the controller 508.

In addition to exchanging data with the liquid sensor management component 504, the controller 508 may also receive data from one or more control elements of a liquid cooling system 520. For example, the controller 508 may receive data from any one or more of a pressure sensor 524, temperature sensor 526, liquid level sensor 528, or other sensors disposed throughout the liquid cooling system 520 in order to determine operational parameters of the liquid cooling system, such as whether a pressure, temperature, or liquid level of the liquid cooling system is within a nominal range associated with normal operation. In some embodiments, the controller 508 may also be operable to control a pump 522 in the liquid cooling system 520 to shut off or slow the liquid cooling system in response to detecting a leak.

Figure 6:
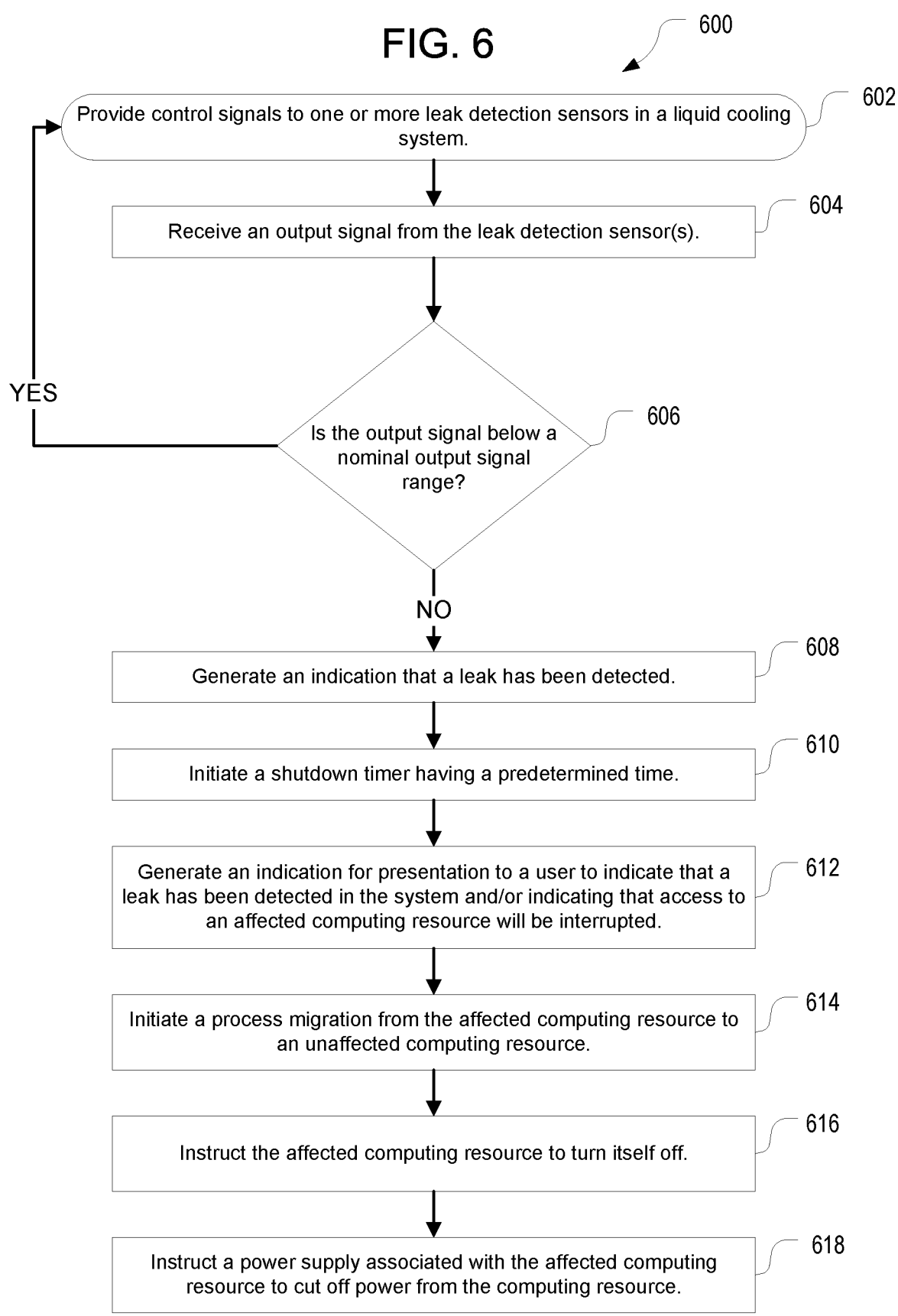
FIG. 6 illustrates a first example process for providing leak detection in a cooling system, according to some embodiments.

FIG. 6 illustrates a first example process 600 for providing leak detection in a cooling system, according to some embodiments. Steps shown in the example process 600 can be implemented in accordance with a leak detection system such as system 500 (FIG. 5), in order to detect and respond to leaks in a liquid cooling system such as liquid cooling system 120 (FIGS. 1-2).

According to embodiments, a management component or controller for a leak detection system for a liquid cooled computing resource can provide a control signal to one or more leak detection sensors disposed in a liquid cooling system (act 602). In response, the leak detection sensor or sensors output an output signal to the management component that indicates whether a leak has occurred (act 604). If the sensors do not sense a leak (act 606), the system will iteratively provide control signals to the sensors to test for a leak. This process step may be continuous (i.e., a continuous control signal provided), or may be performed at discrete sampling intervals. If a leak has been sensed at a sensor controller (act 606), the system will proceed to generate an indication that a leak has been detected (act 608). Upon receiving the indication, the system can initiate a shutdown timer having a predetermined countdown time for accommodating a shutdown procedure in order to protect components of the computing resource (act 610).

The shutdown procedure can include various process steps, including generating an indication for presentation to a user, e.g. via a user interface or by interrupting a process in use by the user, indicating that a leak has been detected in the system (act 612). This indication an include, e.g., providing an error report or servicing request for review by an administrator or technician; indicating to a client that access to the computing resource will be interrupted; or both. In some embodiments, the system can begin immediately initiating a migration of some or all operating processes or services on the affected computer resource to an alternative, unaffected computing resource (act 614). For example, a virtual machine or other software program that is running on the affected computer resources can be shut down and restarted on another computer resource, either in the same rack or in another rack. As another example, data stored in the affected computer resource can be copied to another storage device in another computer resource, either in the same rack or in another rack.

Once the shutdown procedures have been completed, or once the timer has expired, the system can instruct the affected computing resource to shut down (act 616). In some cases, the system can independently instruct a power supply associated with the affected resource to disconnect the resource from power, in order to protect the resource from potential liquid intrusion (act 618).

Figure 7:
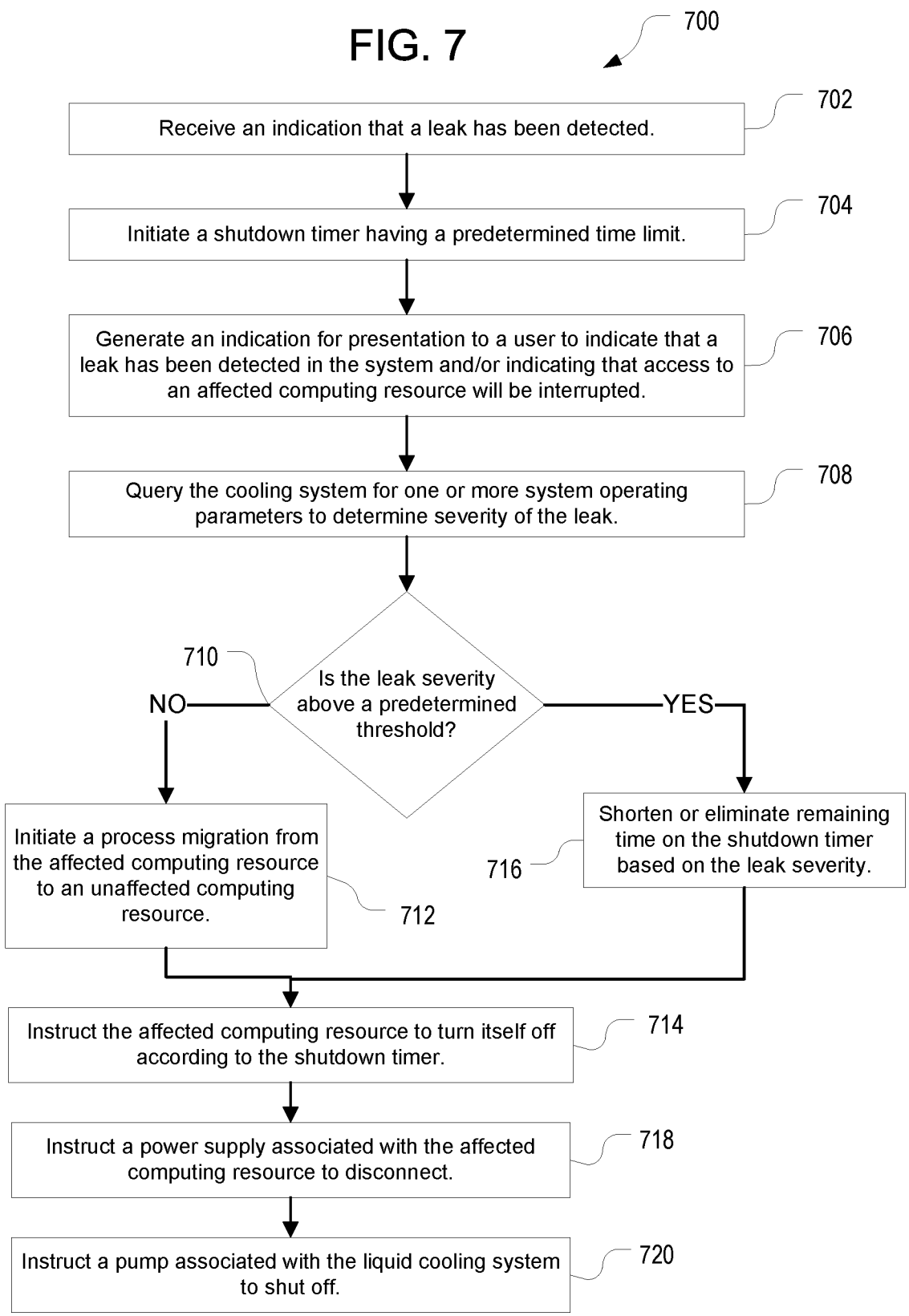
FIG. 7 illustrates a second example process for providing leak detection in a cooling system, according to some embodiments.

FIG. 7 illustrates a second example process 700 for providing leak detection in a cooling system, according to some embodiments. Steps shown in the example process 700 can be implemented in accordance with a leak detection system such as system 500 (FIG. 5), in order to detect and respond to leaks in a liquid cooling system such as liquid cooling system 120 (FIGS. 1-2). Aspects of process 700 can be performed in conjunction with process 600 described above with respect to FIG. 7.

According to embodiments, a management component or controller for a leak detection system for a liquid cooled computing resource receive an indication that a leak has been detected (act 702). This indication can be received according to, e.g., example process steps 602-608 of process 600 described above with reference to FIG. 6.

In response to receiving the indication that the leak has been detected, the system can initiate a shutdown timer having a predetermined time limit (act 704) and begin counting down. The system can subsequently generate an indication for presentation to user that the leak has been detected and/or that access to the computing resource will be interrupted (act 706). Subsequently, or in parallel with the above process steps, the system can query a cooling system for one or more additional parameters to determine a severity of the detected leak (act 708). In some cases, determining the severity of the leak can include detecting a specific location of the leak. For example, in some embodiments, a leak detected at a sensor connected with a radiator or other component that is positioned at a remove from processors, memory, or other critical computing elements can be deemed a low severity leak, while a leak associated with a heat exchanger of a processor or other component mounted to a motherboard may be deemed a high severity leak. Alternatively, or in addition, when a leak is detected in conjunction with one or more operating errors in a cooling system, the leak may be deemed high severity. Suitable operating errors for designating a high severity leak may include, e.g., overpressure, underpressure, high temperature, low temperature, low system volume, high system volume, or an error in the operation of a pump.

If the leak is designated low severity (act 710), the system can proceed to perform any suitable intermediate actions for protecting the computing resource and/or preserving data, such as initiating a process migration from the affected computing resource (act 712). However, if the leak is designated high severity (act 710), the system can bypass the shutdown timer, either by shortening the time remaining or by eliminating the time remaining, to expedite protective shutdown of the computing resource (act 716). In either event, the system can subsequently instruct the affected computing resource to turn itself off (act 714). In some cases, the system can also, or alternatively, instruct a power supply associated with the computing resource to disconnect the computing resource from power (act 718). In some embodiments, the system can further communicate with control elements of the cooling system to, e.g., turn off a pump at the cooling system in order to slow the leak (act 720).

Some or all of the processes 600 or 700 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a non-transitory computer-readable storage medium, for example, in the form of a computer program comprising a plurality of instructions executable by one or more processors.

Figure 8:
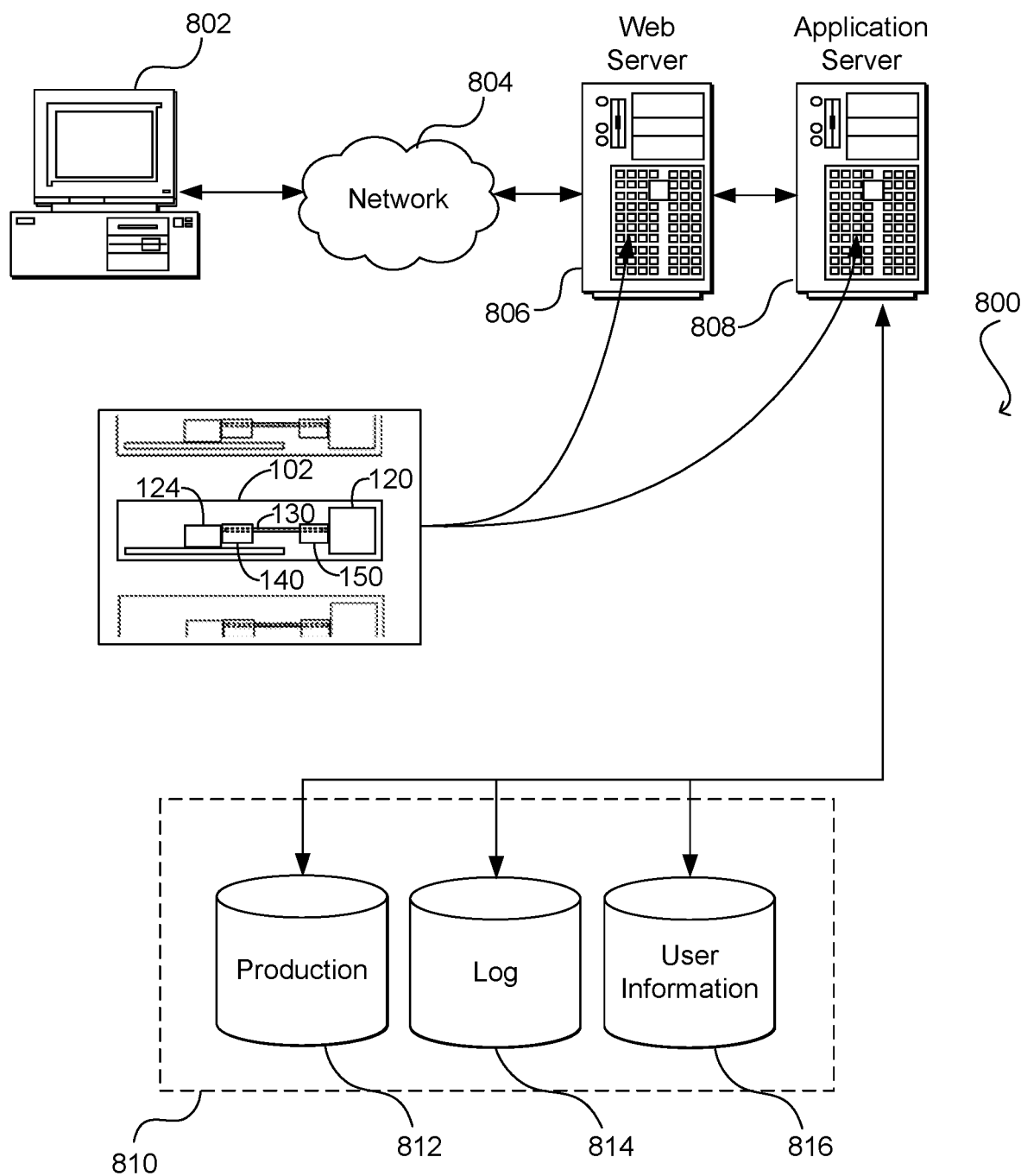
FIG. 8 illustrates an environment in which various embodiments can be implemented.

FIG. 8 illustrates aspects of an example environment 800 for implementing aspects in accordance with various embodiments. As will be appreciated, although a Web-based environment is used for purposes of explanation, different environments may be used, as appropriate, to implement various embodiments. The environment includes an electronic client device 802, which can include any appropriate device operable to send and receive requests, messages, or information over an appropriate network 804 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art. Although both client-side and server-side devices may employ liquid cooling, liquid cooled systems are especially desirable in the demanding computing environment associated with the server-side devices as represented by the Web server 806.

The illustrative environment includes at least one application server 808 and a data store 810. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 802 and the application server 808, can be handled by the Web server. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 802. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

In accordance with various embodiments, the processor of the server, multiple processors of the server, or additional computing components such as memory, power supplies, electronic transfer devices, and the like, may each generate significant heat and may benefit from the use of liquid cooling systems similar to those discussed above. Further, each server may be used at least somewhat interchangeably to provide access to services for the client device 802.

For example, multiple servers may be enabled to process certain requests, and processes operating on one of the servers may be migrated to a different server without diminishing the capacity of the system 800 to handle client requests. As discussed above, processes may be migrated in response to detecting a fault with a particular server, such as a leak associated with the processor or other hardware associated with that server.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and APPLETALK. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, JAVA servers, and business application servers. The server(s) also may be capable of executing programs or scripts in response to requests from user devices, such as by executing one or more Web applications that may be implemented as one or more scripts or programs written in any programming language, such as JAVA®, C, C#, or C++, or any scripting language, such as PERL, PYTHON, or TCL, as well as combinations thereof. The server(s) may also include database servers, including without limitation those commercially available from ORACLE®, MICROSOFT®, SYBASE®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An assembly, comprising:
a first basin comprising a bottom, first and second ends, and first and second sides defining an interior volume, wherein:
the first end comprises a first end wall having a first cavity configured to receive a coolant line;
the first side, second side, and second end comprise, respectively, a first sidewall, second sidewall, and a second end wall configured to limit airflow from an environment of the assembly into the interior volume of the basin; and
the bottom comprises at least two opposing slopes that converge toward a low portion of the interior volume, the at least two opposing slopes being arranged to collect liquid coolant in the basin at the low portion of the interior volume; and
a liquid sensor positioned at the low portion of the interior volume and operable to detect liquid coolant collected at the low portion.

2. The assembly of claim 1, wherein the second end wall comprises a second cavity configured to connect the basin with a coolant line.

3. The assembly of claim 1, further comprising:
a connecting flange coupled with one of the first or second sides and extending from one of the first or second sides toward the basin and arranged to interact with the liquid sensor to retain the sensor below, or to align the sensor with, a location corresponding to a connection of a coolant line when the coolant line is connected with the assembly.

4. The assembly of claim 1, wherein:
the sensor comprises a live wire and a ground wire separated by a short distance, the sensor having a first resistance when the sensor is dry and a second resistance lower than the first resistance when the sensor is in contact with liquid coolant; and
the sensor is capable of detecting liquid coolant collected in the low portion at volumes less than or equal to 1.0 ml when the sensor is installed in the low portion.

5. The assembly of claim 1, wherein the basin defines an interior volume of less than 30 ml.

6. The assembly of claim 1, wherein:
the bottom further comprises a collection cavity positioned at the low portion of the interior volume and configured to collect liquid from the basin; and
the sensor is disposed in the collection cavity.

7. The assembly of claim 1, wherein:
the first end wall further has a second cavity in the first end wall offset from the first cavity, the first and second cavities configured to receive first and second cooling lines, respectively.

8. The assembly of claim 1, further comprising:
a static vane connected with the basin and positioned offset from the basin and configured to divert an ambient flow of air around the basin.

9. The assembly of claim 1, further comprising a second basin different from the first basin, the second basin comprising:
a second bottom having a second sloped interior surface that defines a second low portion;
a second end wall having a second cavity configured to receive a coolant line; and
a second liquid sensor positioned at the second low portion and operable to detect liquid coolant collected in the second basin.

10. The assembly of claim 9 further comprising:
a coolant line received in one of the first or second cavities; and
a first heat exchanger which is connected with the coolant line within or above one of the basins and which is also configured to connect with a processor for drawing heat from the processor into the coolant line.

11. The assembly of claim 10, wherein the coolant line is received in both the first and second cavities, the assembly further comprising a second heat exchanger comprising a fan for exhausting heat from the coolant line into an environmental flow of air, the second heat exchanger connected with the coolant line within or above one of the second or first basins.

12. The assembly of claim 9, further comprising a third cavity in the second end wall offset from the second cavity and configured to receive a coolant line.

13. The assembly of claim 9, further comprising:
a coolant line received in one of the second or first cavities; and
a heat exchanger comprising a fan for exhausting heat from the coolant line into an environmental flow of air, the heat exchanger connected with the coolant line within or above one of the second or first basins.

14. A system, comprising:
a computing system cooling assembly including a first heat exchanger configured to transfer heat from a computing component to a liquid coolant, a second heat exchanger configured to extract heat from the liquid coolant, and a coolant line to transfer the liquid coolant between the first heat exchanger and the second heat exchanger;
a first basin connected with the coolant line, the basin comprising a bottom, first and second ends, and first and second sides defining an interior volume, wherein,
the first end comprises a first end wall having a first cavity receiving the coolant line;
the first side, second side, and second end comprise, respectively, a first sidewall, second sidewall, and a second end wall configured to limit airflow into the interior volume of the basin; and
the bottom comprises at least two opposing slopes that converge toward a low portion of the interior volume, the at least two opposing slopes being arranged to collect liquid coolant in the basin at the low portion of the interior volume; and
a liquid sensor positioned at the low portion of the interior volume of the basin and operable to detect liquid coolant collected at the low portion.

15. The system of claim 14, wherein the first heat exchanger is thermally coupled with the computing component and the second heat exchanger comprises a radiator.

* * * * *